United States Patent
Fonseca et al.

(10) Patent No.: US 9,281,251 B2
(45) Date of Patent: Mar. 8, 2016

(54) SUBSTRATE BACKSIDE TEXTURING

(71) Applicant: Tokyo Electron Limited, Tokyo (JP)

(72) Inventors: Carlos A Fonseca, Austin, TX (US); Anton Devilliers, Clifton Park, NY (US); Benjamen M Rathsack, Austin, TX (US); Jeffrey T Smith, Clifton Park, NY (US); Lior Huli, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/453,352

(22) Filed: Aug. 6, 2014

(65) Prior Publication Data
US 2015/0044785 A1 Feb. 12, 2015

Related U.S. Application Data

(60) Provisional application No. 61/864,151, filed on Aug. 9, 2013, provisional application No. 61/864,212, filed on Aug. 9, 2013.

(51) Int. Cl.
| | |
|---|---|
| *C23F 1/00* | (2006.01) |
| *H01L 21/66* | (2006.01) |
| *H01L 21/306* | (2006.01) |
| *G03F 7/20* | (2006.01) |

(52) U.S. Cl.
CPC ............ *H01L 22/20* (2013.01); *G03F 7/70783* (2013.01); *H01L 21/30625* (2013.01); *H01L 22/12* (2013.01)

(58) Field of Classification Search
CPC .......................... H01L 21/30625; H01L 22/12
USPC .................................. 438/689, 692, 745, 753
See application file for complete search history.

(56) References Cited

U.S. PATENT DOCUMENTS

| | | | |
|---|---|---|---|
| 5,778,481 A | 7/1998 | Amsden et al. | |
| 6,392,738 B1 | 5/2002 | van de Pasch et al. | |
| 6,927,167 B2 * | 8/2005 | Fukuda et al. | 438/689 |
| 7,672,110 B2 * | 3/2010 | Sun et al. | 361/234 |
| 7,831,083 B1 * | 11/2010 | Lauber | 382/141 |
| 8,072,044 B2 * | 12/2011 | Gruenhagen et al. | 257/618 |
| 8,212,250 B2 * | 7/2012 | Forbes | 257/53 |
| 2004/0040576 A1 | 3/2004 | Sun et al. | |
| 2006/0138681 A1 * | 6/2006 | Best et al. | 257/797 |
| 2009/0037699 A1 | 2/2009 | Matsuzawa | |

OTHER PUBLICATIONS

Beaudoin, et al., "Chemical Mechanical Polishing (CMP) Overview" Presentation, NSF/SRC Engineering Research Center for Environmentally Benign Semiconductor Manufacturing, 1999.
Fogler, et al. "Elements of Chemical Reaction Engineering: Strategies for Creative Problem Solving Website—Essentials of CRE Website", University of Michigan, Fourth Edition, Chapter 10, 2008, http://www.umich.edu/~elements/10chap/html/10prof4.htm.
http://en.wikipedia.org/wiki/Etching_microfabrication), retrieved Jul. 9, 2014.
Taiwanese Office Action issued in TW 103127368 dated Oct. 14, 2015 with English Language Translation.

* cited by examiner

*Primary Examiner* — Duy Deo
*Assistant Examiner* — Maki Angadi
(74) *Attorney, Agent, or Firm* — DLA Piper LLP (US)

(57) ABSTRACT

Embodiments described relate to a method and apparatus for reducing lithographic distortion. A backside of a semiconductor substrate may be texturized. Then a lithographic process may be performed on the semiconductor substrate having the texturized backside.

19 Claims, 7 Drawing Sheets

| Chemical | Purpose (etch) |
|---|---|
| TMAH (tetramethylammonium hydroxide) | Si |
| HF (hydrofluoric acid) | $SiO_2$ |
| HF Nitric (hydrofluoric acid + nitric acid) | Si |
| $H_3PO_4$ (phosphoric acid) | $Si_3N_4$ |
| $NH_4F$ (ammonium fluoride) | Si |
| KOH (potassium hydroxide) | Si |
| HF + $H_2O_2$ (hydrofluoric acid + hydrogen peroxide) | Si |
| $NH_4OH$ (ammonium hydroxide) | Si |
| $NH_4OH$ + $H_2O_2$ (SC-1) | Si |
| IPA + $NH_4F$ (isopropyl alcohol + ammonium fluoride) | Si |

FIG. 4

SUBSTRATE BACKSIDE TEXTURING

This application is based on and derives the benefit of the filing date of U.S. Provisional Patent Application No. 61/864,151, filed Aug. 9, 2013 and U.S. Provisional Patent Application No. 61/864,212, filed Aug. 9, 2013, the contents of both of which are incorporated herein by reference in their entirety.

In order to expose a semiconductor substrate during manufacture of an integrated circuit (IC), the substrate may be chucked on an imaging scanner or camera. During chucking, the wafer can be thought of as a "pancake" that is able to "wrinkle", resulting in significant distortion of images projected onto the wafer. This impacts overall performance when aligning multiple lithographic layers in integrated circuit manufacturing.

Embodiments described herein relate to a method and apparatus for reducing lithographic distortion. A backside of a semiconductor substrate may be texturized. Then a lithographic process may be performed on the semiconductor substrate having the texturized backside.

A detailed description of several embodiments will now be provided, taken in conjunction with the accompanying drawings, of which:

FIG. 4 is a chart illustrating semiconductor substrate materials and corresponding etchants;

Typically in IC manufacturing, the backside of semiconductor substrates may be contaminated during processing. The contamination may include residual films and organic and inorganic particles. Such contamination may result from many steps in the manufacturing process such as thermal material growth, e.g., growing SiN or $SiO_2$ films, photoresist processing, rapid thermal annealing and/or chemical vapor deposition (CVD). In addition, the backside substrate surface may also become scratched due to wafer handling such as by robotic arms during wafer transfers from tool to tool.

Figure 1:
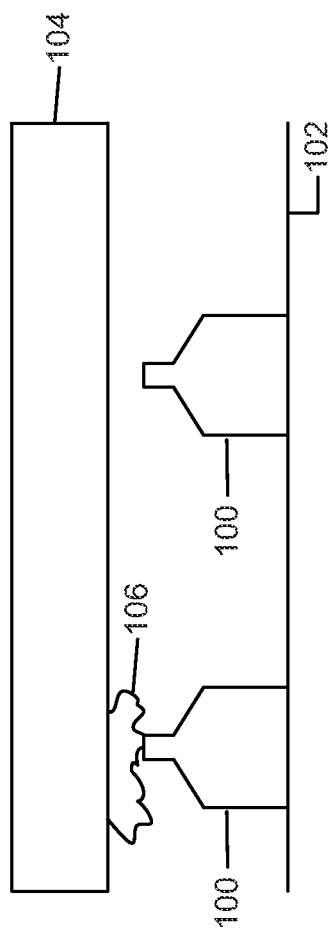
FIG. 1 is a simplified diagram of chuck pins and a semiconductor substrate.

The condition of the wafer backside may play a significant role in the final wafer distortion signature that results during chucking on an imaging scanner or camera. FIG. 1 shows contact areas, such as chuck pins 100, and wafer stage 102 receiving semiconductor substrate 104. Particles 106 are attached to the back surface of semiconductor substrate 104. The interaction between the backside surface of substrate 104 and chuck pins 100 determines how substrate 104 will slip across pins 100. When the backside of substrate 104 is not uniform, such as when particles 106 are present or surface unevenness exists, substrate 104 slips differently at each pin 100, resulting in non-uniform substrate distortions. Non-uniform substrate distortions are undesirable because such distortions may result in poor overlay performance.

To improve distortion uniformity and, perhaps, improve overlay performance, the backside surface of semiconductor substrate 104 which contacts chuck pins 100 may be texturized to produce a more uniform wafer distortion due to wafer slippage on the chuck. The backside of semiconductor substrate 104 is texturized to produce a smaller coefficient of friction which improves the slippage uniformity across the backside of the semiconductor substrate 104 during scanner chucking.

Figure 2:
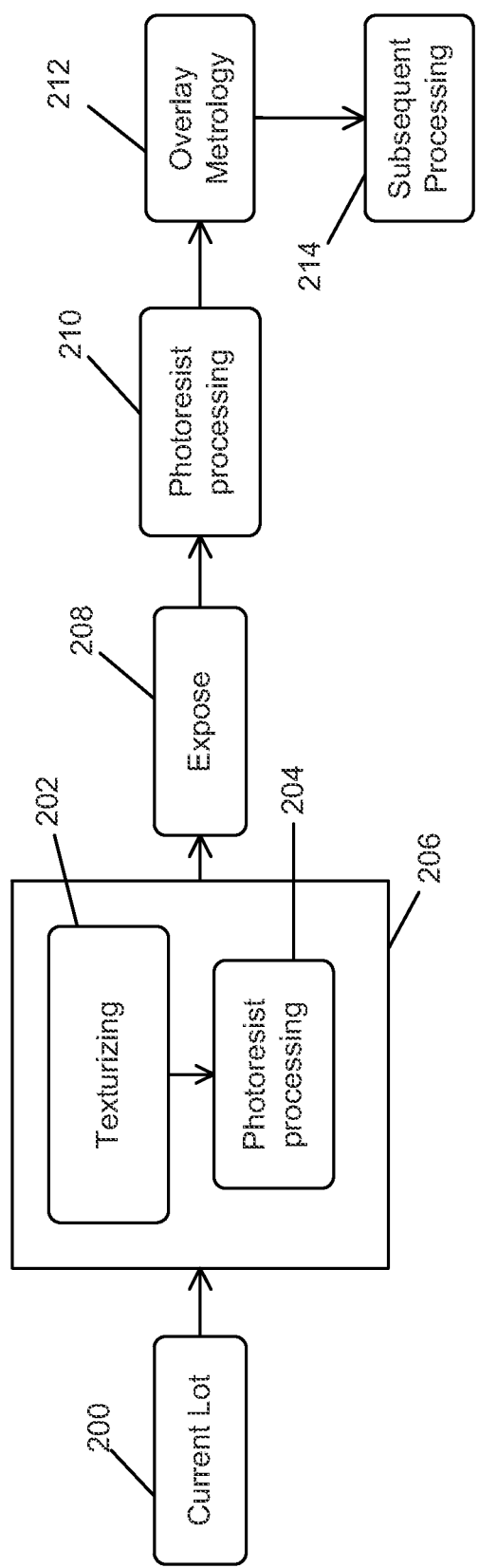
FIG. 2 is a schematic illustration of a process according to an embodiment.

FIG. 2 illustrates a process for improving distortion uniformity according to an embodiment. A lot of substrates 200 are texturized at 202 and then undergo photoresist processing at 204. Photoresist processing 204 may include photoresist coating and baking a top surface of each substrate 200. Texturizing 202 and photoresist processing 204 may be performed with a wafer track system 206.

Subsequent to photoresist processing 204, each semiconductor substrate 200 may be exposed 208 in a scanner for which each substrate 200 may be chucked on chuck pins 100. Then each semiconductor substrate 200 undergoes further photoresist processing 210 to develop the photoresist. Next, at 212, overlay metrology is performed, such as, for example, using an Archer tool. Subsequent processing may then be performed at 214 such as, for example, etching.

Prior to texturizing 202, the contact areas, e.g., chuck pins 100, of the photolithographic tool employed at exposing 208, may be determined. The texture of the backside of one or more substrates in lot 200 may be determined. As explained in more detail below, the determining may be based at least in part on the frequency of backside features at one or more portions of the semiconductor substrate, the amplitude of the backside features at one or more portions of the semiconductor substrate, and/or a size of the one or more contact areas The determining may employ a microscopy tool including a computer having a processor and a computer readable, non-transitory medium, such as a memory. The memory may store program instructions for causing the processor to control the microscopy tool to determine backside surface texturing.

Texturizing 202 of the substrate backside may be accomplished chemically, mechanically or with a plasma process. Optionally, as a preliminary process, the backside of the substrate may be cleaned to remove contamination, such as particles or residual films. Texturizing 202 modifies the surface of the substrate to achieve a smaller and uniform coefficient of friction as compared to a substrate where the backside has not been texturized. A smaller and more uniform coefficient of friction may yield more uniform wafer distortion signatures during chucking and thus improves overlay performance during subsequent lithography level stacking.

Figure 3:
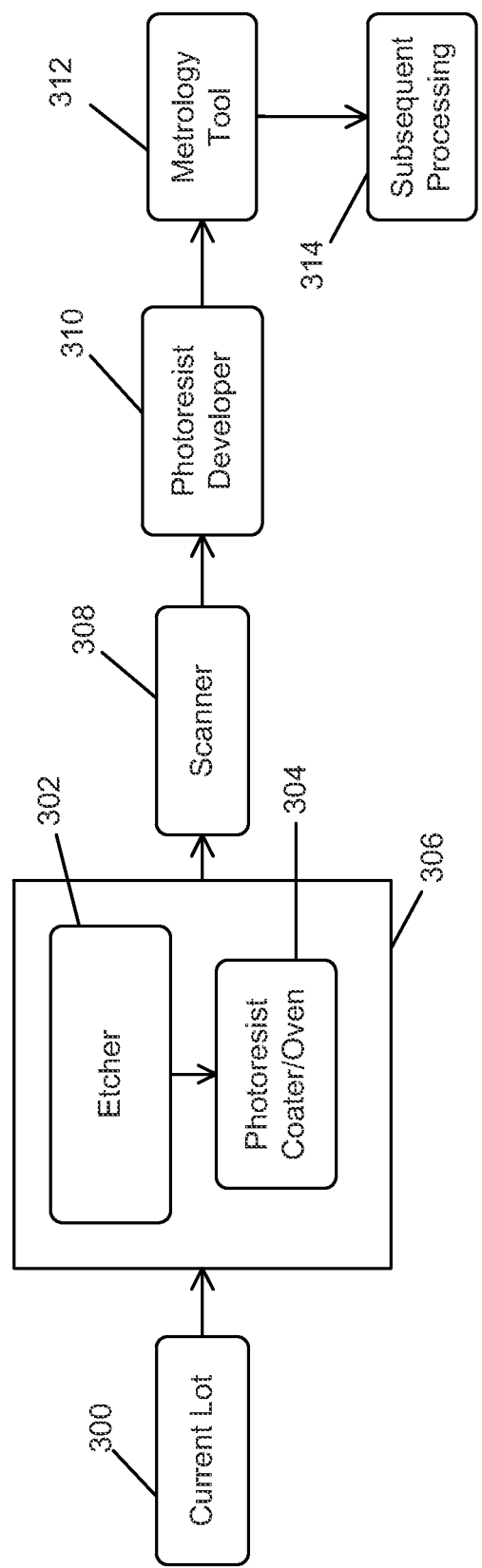
FIG. 3 is a schematic diagram of apparatus according to an embodiment.

FIG. 3 illustrates apparatus to improve distortion uniformity according to an embodiment. Semiconductor substrates in lot 300 are provided to etcher 302 which texturizes the backside of the substrate. As noted above, the substrates may first be provided to a cleaning station to clean the substrate backsides or cleaning may occur in etcher 302 or cleaning may occur in etcher 302. Subsequent to etcher 302, the substrates 300 may be provided to photoresist coater/oven 304. In coater/oven 304, photoresist material is applied to the top side of the substrate and baked thereon. Etcher 302 and coater/oven 304 may be parts of wafer track system 306.

Substrates with the photoresist layer may then be exposed in scanner 308 for which each substrate 300 may be chucked on chuck pins 100. Then, substrates are passed to photoresist developer 310. After the photoresist has been developed, the substrate may be passed to an overlay metrology tool 312, such as an Archer tool, for measurements to be made. Subsequently, each substrate is passed for subsequent processing 314.

As noted above, texturizing 202 may be accomplished chemically. Thus, etcher 302 may be a chemical etcher. The chemical etchant employed depends upon the material to be removed. Texturizing 202 may include treatment with an etchant to remove unwanted residual films, such as silicon nitride, oxide, etc.; an etchant to remove silicon in a manner that texturizes the substrate backside; or a combination of both. Etchants that can be used to etch silicon substrate and/or materials on the substrate backside are listed in FIG. 4. FIG. 4 provides examples of materials to be etched and corresponding etchants, but a list of possible substrate materials and corresponding etchants is not limited to those identified in FIG. 4. Those of ordinary skill in the art know of other substrate materials and etchants that may be employed. For example, other substrate materials may include GaAs, sapphire, gadolinium gallium garnet (GGG) and lithium niobate. A combination of two or more chemicals may be used to control the etch rate for a substrate which, in turn, determines the resulting geometry for the surface, such as whether the surface is pitted or smooth.

In addition to etching, another way to change the coefficient of friction of the substrate backside is to chemically change the material characteristics or properties at an atomic level. The use of vapor treatment such as HMDS (Hexamethyldisilazane) or other vapor treatments, well known to those skilled in the art, that react with the substrate backside surface may be employed. For example, the etchants listed in FIG. 4, in more dilute form, may also chemically alter the substrate backside. By chemically changing the surface, different surface energy and friction properties may be achieved, changing the interaction of the substrate with the chuck pins 100 on the scanner stage 102.

Texturizing 202 may alternatively include a plasma or dry etcher 302. As with chemical etching, the purpose is to remove unwanted residual films; etch silicon in a manner that texturizes the wafer surface; or a combination of both.

Figure 5:
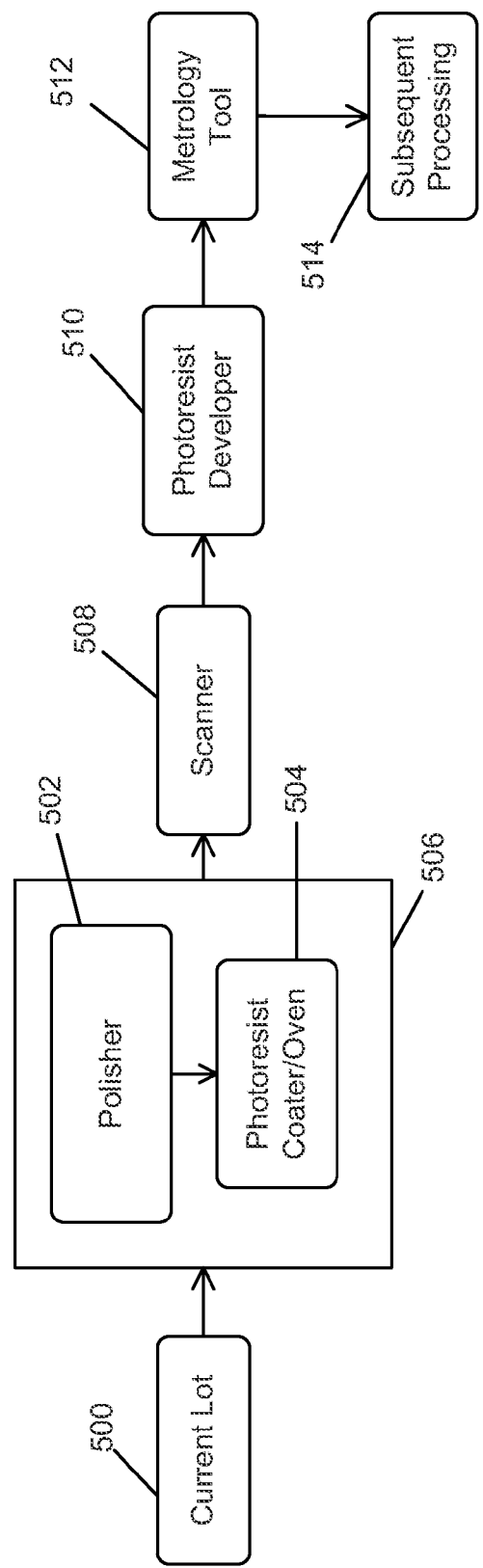
FIG. 5 is a schematic illustration of apparatus according to an embodiment.

Alternatively, texturizing 202 may be accomplished by polishing. FIG. 5 illustrates apparatus to improve distortion uniformity employing a polisher. Semiconductor substrates in lot 500 are provided to polisher 502 which texturizes the backside of the substrate. As noted above, the substrates may first be provided to a cleaning station to clean the substrate backsides. Subsequent to polisher 502, the substrates may be provided to photoresist coater/oven 504. In coater/oven 504, photoresist material is applied to the top side of the substrate and baked thereon. Polisher 502 and coater/oven 504 may be parts of wafer track system 506.

Substrates with the photoresist layer may then be exposed in scanner 508 for which each substrate 500 may be chucked on chuck pins 100. Then, substrates are passed to photoresist developer 510. After the photoresist has been developed, the substrate may be passed to an overlay metrology tool 512, such as an Archer tool, for measurements to be made. Subsequently, each substrate is passed for subsequent processing 514.

Polisher 502 may include a rotating polishing brush that scrubs/scratches the substrate backside to remove contamination and create a desired texture. The head of rotating polishing brush may include a surface which contacts the substrate with diamond particles embedded therein. Those of ordinary skill in the art will understand that any appropriate hard material may be employed to contact the substrate backside. As an alternative to diamond particles, silicon carbide may also be employed.

The polishing brush may contact the wafer in a dry state. Alternatively, a slurry material may be added during the polishing process. The slurry may include an abrasive. Alternatively, chemical agents, such as HDMS, TMAH or any of the etchants listed in FIG. 4 may be employed during the polishing process.

Figure 6:
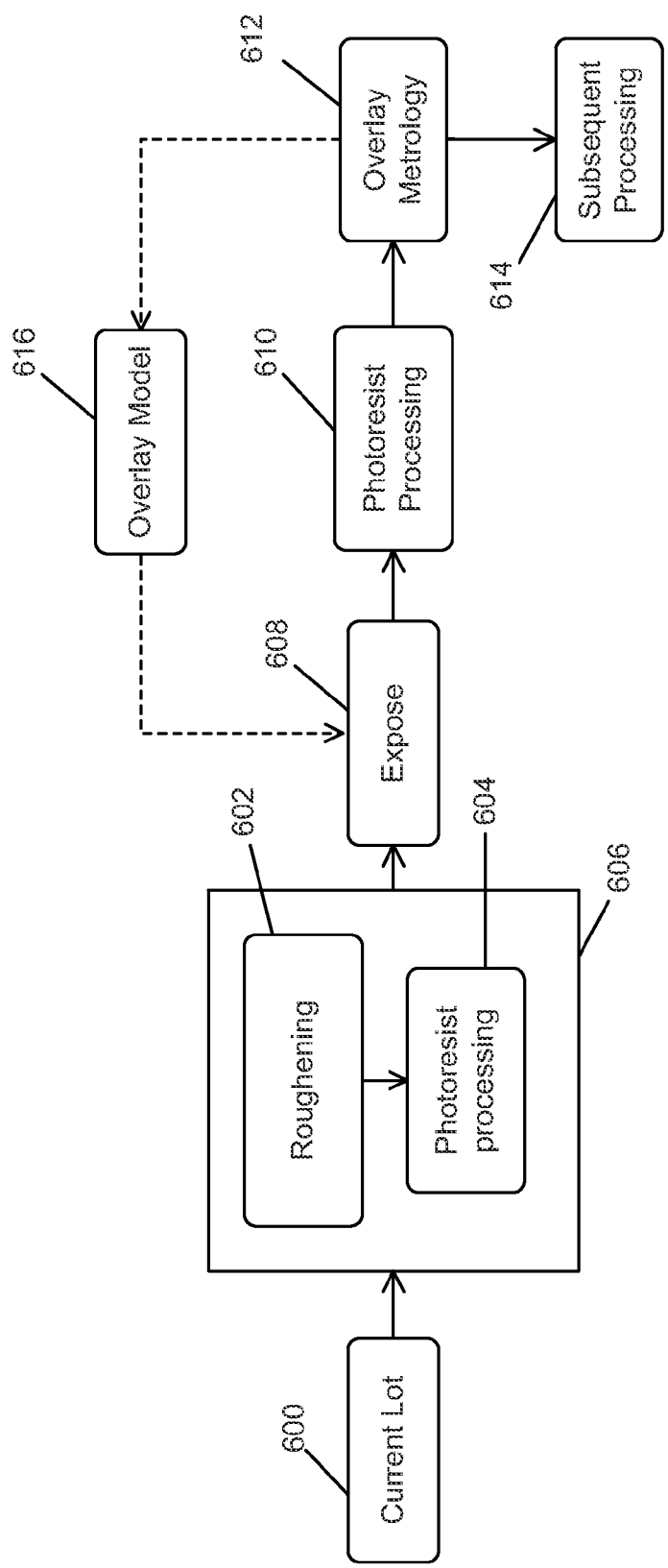
FIG. 6 is a schematic illustration of a process according to an embodiment.

FIG. 6 illustrates a process alternative to FIG. 2 for improving distortion uniformity. Elements 600-614 may be similar to elements 200-214 in FIG. 2 and therefore a description will not be repeated. Once overlay metrology measurements have been taken at 612, the measurements may be employed to create an overlay model 616 that corrects for overlay signatures. The overlay model 616 is employed to modify the exposure at 608 to compensate for the overlay signatures. This feedback process may be repeated, for example, every 10 to 12 lots of substrates.

Figure 7:
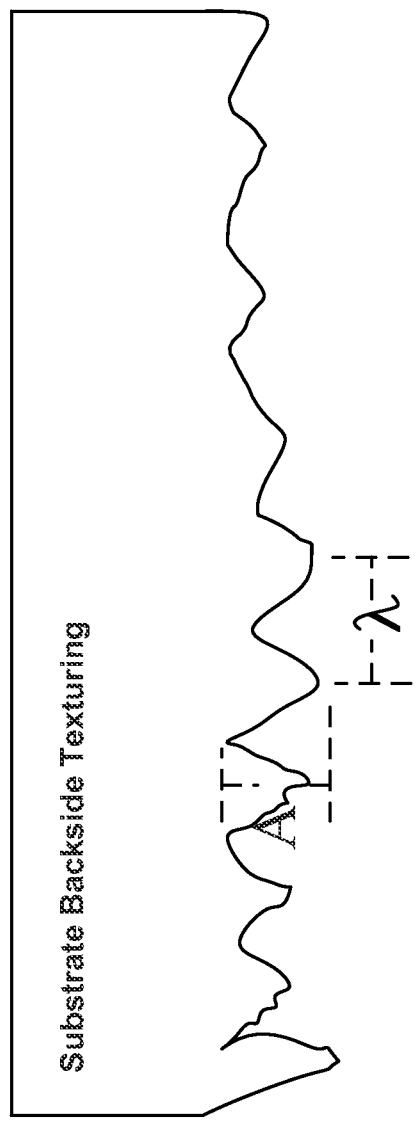
FIG. 7 is a schematic illustration of roughness associated with a backside of a semiconductor substrate.

FIG. 7 represents a schematic illustration of texturing on a substrate backside. Texturing provides a controlled degree of roughness. The roughness may be described as a series of valleys and ridges in the substrate. The roughness may be characterized by amplitude A, representing the vertical distance from a valley to a peak, and a period $\lambda$, which indicates a peak-to-peak distance. The roughness may also be characterized by the uniformity of the amplitude and/or period over the area of the substrate backside. Atomic Force Microscopy (AFM) may be employed to measure or quantify these metrics. The microscopy tool may be controlled by a computer including a processor and a computer readable, non-transitory medium, such as a memory. The memory may store program instructions for causing the processor to control the microscopy tool to determine backside surface texture based on more or more of the parameters discussed above and/or the size of the contact areas of the photolithography tool.

Optimum texturing characteristics is dictated by the interaction of the semiconductor substrate 104 and chuck pins 100 on scanner 102. The interaction between the substrate 104 backside and chuck pins 100 as a vacuum is applied during chucking is primarily determined by the coefficient of friction that exists between the two surfaces. In general, the coefficient of friction becomes higher as the backside of the substrate 104 becomes both smoother and less smooth from an optimal range. A higher coefficient of friction results in larger distortion levels. Furthermore, the uniformity of the coefficient of friction across the wafer may impact the uniformity of substrate slippage which also affects distortion. Larger non-uniformity may result in substrate distortion which has greater variability across the substrate, which leads to worsened overlay performance.

In general, the backside of the semiconductor is textured to impact the effective contact surface area between chuck pins 100 and substrate 104. In general, an optimal range may exist for the period $\lambda$ of the texturing. If the period $\lambda$ of the texturing is too small, the substrate 104 backside may touch the chuck pins 100 at too many locations to minimize the coefficient of friction. If the period $\lambda$ becomes too large, the number of touch points between the substrate 104 and the chuck pins 100 may become so small that the substrate 104 catches on the chuck pins 100, increasing the coefficient of friction. The amplitude A of the texture on the wafer backside may also play a role in determining the coefficient of friction, particularly when taking into consideration the surface roughness of the chuck pins 100 themselves. Therefore, an embodiment can also involve characterization of the texture amplitude A to minimize the coefficient of friction.

In one embodiment, the backside texture may have an amplitude A that is within 50 nm across at least a portion of the backside of the substrate.

Typically, chuck pins 100 may have a diameter on the order of 150 microns. The coefficient of friction may be minimized if the period $\lambda$ of the texturing is smaller than the width of each contact pin 100. The coefficient of friction may be minimized if 5-20 touch points exist between the backside surface and each chuck pin 100. The period $\lambda$ of the texturing may be $\frac{1}{5}$ to $\frac{1}{10}$ of the width of each chuck pin 100. The backside features may contact each chuck pin at a frequency of no more than 70 contacts per millimeter. Alternatively, the backside features may contact each chuck pin at a frequency of 5-10 contacts per micron.

In one embodiment, the amplitudes A of the backside features may be within 10 nm distribution of each other.

In other embodiments, the amplitude, period and/or uniformity requirements listed above may be combined together, used individually, or used collectively while omitting one or more of the requirements.

Although several embodiments have been described in detail above, those skilled in the art will readily appreciate that many modifications are possible in the described embodiments without materially departing from the novel teachings of this invention. Accordingly, all such modifications are intended to be included within the scope of this invention as defined by the following claims.

What is claimed is:

1. A method for determining backside texturing of a semiconductor substrate that is processed on a photolithography tool, comprising:
    determining one or more contact areas on the photolithography tool for the semiconductor substrate;
    determining a backside surface texturing for the semiconductor substrate that is based, at least in part, on:
        a frequency of backside features of the semiconductor substrate at one or more portions of the semiconductor substrate,
        an amplitude of the backside features at the one or more portions of the semiconductor substrate, or
        a size of the one or more contact areas; and
    processing the semiconductor substrate to obtain a target backside surface texturing that reduces the coefficient of friction between the substrate and the one or more contact areas, the target backside surface texturing comprising backside features occurring at a period that is $1/5$ to $1/10$ of a size of the one or more contact areas.

2. The method of claim 1, wherein the processed backside contacts each of the one or more contact area at a frequency of no more than 70 contacts per millimeter.

3. The method of claim 1, wherein the amplitude of the backside features varies by no more than 10 nm of each other.

4. The method of claim 1, wherein the processing comprises:
    removing one or more films from the backside of the semiconductor substrate with at least one chemical agent;
    removing a material of the backside of the semiconductor substrate from the backside with at least one chemical agent; or
    a combination thereof.

5. The method of claim 4, wherein the at least one chemical agent comprises one or more of the following: TMAH, HF, HF Nitric, $H_3PO_4$, $NH_4F$, KOH, $HF+H_2O_2$, $NH_4OH$, $NH_4OH+H_2O_2$, HMDS, or $IPA+NH_4F$.

6. The method of claim 1, wherein the processing comprises polishing the backside with a rotating device that removes at least a portion of the semiconductor substrate or elements adhering to the backside of the semiconductor substrate.

7. The method of claim 6, wherein the processing comprises using chemical slurry during the polishing.

8. The method of claim 6, wherein the processing comprises removing one or more films and/or a material of the backside with at least one chemical agent in conjunction with the polishing.

9. A method for improving backside texturing of a semiconductor substrate, comprising:
    determining a type of photolithography tool that will be used to process the semiconductor substrate, the photolithography tool comprising one or more contact areas that will support the semiconductor substrate during a light exposure process in the photolithography tool; and
    processing the semiconductor substrate to obtain a backside texturing that is based, at least in part, on a size comparison of the one or more contact areas and a topography of a backside of the semiconductor substrate, the backside texturing comprising backside features occurring at a period that is $1/5$ to $1/10$ of a size of the one or more contact areas.

10. The method of claim 9, wherein the topography is based, at least in part, on distances between features on the backside of the semiconductor substrate.

11. The method of claim 9, wherein the topography is based, at least in part, on amplitudes of the features on the backside of the semiconductor substrate.

12. The method of claim 9, wherein the backside texturing comprises a horizontal distance component that is less than a width of the one or more contact areas for at least a portion of the backside of the semiconductor substrate.

13. The method of claim 9, wherein the backside texturing further comprises a vertical distance component that is within 50 nm across at least a portion of the backside of the semiconductor substrate.

14. A method of reducing lithographic distortion comprising:
    texturizing a backside of a semiconductor substrate; and
    performing a lithographic process on the semiconductor substrate having the texturized backside with a lithographic tool which supports the substrate at one or more contact areas, the texturing reducing the coefficient of friction between the backside and the one or more contact areas, and the texturing comprising backside features occurring at a period that is $1/5$ to $1/10$ of a size of the one or more contact areas.

15. The method of claim 14, wherein the texturizing comprises:
    removing one or more films from a backside of the semiconductor substrate with at least one chemical agent;
    removing material from the backside of the semiconductor substrate with at least one chemical agent; or
    a combination thereof.

16. The method of claim 14, wherein the texturizing comprises polishing the backside with a rotating device that removes at least a portion of the semiconductor substrate or elements adhering to the backside of the semiconductor substrate.

17. The method of claim 14, wherein the texturized backside contacts each of the one or more contact areas at a frequency of 5-10 contacts per micron.

18. The method of claim 14, wherein the texturized backside has features that vary in distance in a direction perpendicular to a surface of the semiconductor substrate by no more than 10 nm.

19. The method of claim 14, further comprising:
    producing an image on a front surface of the substrate;
    measuring variations in the image from a reference; and
    producing a modified image on a front surface of a subsequent substrate that varies from the image in accordance with the variations.

* * * * *